United States Patent
Rhee

(10) Patent No.: US 9,609,787 B2
(45) Date of Patent: Mar. 28, 2017

(54) PORTABLE ELECTRONIC DEVICE AND BATTERY PACK FOR THE SAME

(71) Applicant: Samsung Electronics Co., Ltd., Suwon-si, Gyeonggi-do (KR)

(72) Inventor: Bongjae Rhee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 14/474,909

(22) Filed: Sep. 2, 2014

(65) Prior Publication Data

US 2015/0077945 A1  Mar. 19, 2015

(30) Foreign Application Priority Data

Sep. 17, 2013 (KR) .................. 10-2013-0111493

(51) Int. Cl.
*H05K 7/20* (2006.01)
*H05K 1/02* (2006.01)
*H01M 2/10* (2006.01)
*H01M 10/615* (2014.01)
*H01M 10/623* (2014.01)
(Continued)

(52) U.S. Cl.
CPC ........ *H05K 7/2039* (2013.01); *H01M 2/1022* (2013.01); *H01M 10/425* (2013.01); *H01M 10/615* (2015.04); *H01M 10/623* (2015.04); *H01M 10/667* (2015.04); *H05K 1/0203* (2013.01); *H05K 1/0296* (2013.01); *H01M 2/1066* (2013.01); *H01M 2200/00* (2013.01); *H01M 2220/30* (2013.01); *H04M 1/0262* (2013.01); *H05K 1/0209* (2013.01); *H05K 1/181* (2013.01); *H05K 2201/066* (2013.01); *H05K 2201/10037* (2013.01); *H05K 2201/10507* (2013.01)

(58) Field of Classification Search
CPC .. H05K 7/2039; H05K 1/0296; H05K 1/0203; H05K 1/0209; H05K 1/181; H05K 2201/066; H05K 2201/10037; H05K 2201/10507; H01M 10/667; H01M 10/425; H01M 10/623; H01M 10/615; H01M 2/1022; H01M 10/5006; H01M 2/1066; H01M 2200/00; H01M 2220/30; H04M 1/0262
USPC .......................... 361/704–714, 720
See application file for complete search history.

(56) References Cited

U.S. PATENT DOCUMENTS 4,791,527 A * 12/1988 Brown ............... H05K 1/189
361/704
6,152,597 A * 11/2000 Potega ............... G01K 1/02
324/104
(Continued)

FOREIGN PATENT DOCUMENTS

EP  2200111 A1  6/2010
GB  2165704 A  4/1986
(Continued)

*Primary Examiner* — Adam B Dravininkas
(74) *Attorney, Agent, or Firm* — Jefferson IP Law, LLP

(57) ABSTRACT

A portable electronic device and a battery pack for the portable electronic device are provided. The portable electronic device includes a Printed Circuit Board (PCB) in which at least one electronic component is disposed, and a battery pack including a heat conductor separately disposed at a gap from the PCB and that transfers heat generated in the electronic component to a battery cell.

14 Claims, 17 Drawing Sheets

(51) Int. Cl.
*H01M 10/42* (2006.01)
*H01M 10/667* (2014.01)
*H05K 1/18* (2006.01)
*H04M 1/02* (2006.01)

(56) References Cited

U.S. PATENT DOCUMENTS

| | | | | |
|---|---|---|---|---|
| 2002/0090546 A1* | 7/2002 | Mu-Tsai | ............ | H01M 2/1022 |
| | | | | 429/120 |
| 2009/0310311 A1* | 12/2009 | Kondoh | ................ | H04B 1/036 |
| | | | | 361/707 |
| 2010/0072952 A1* | 3/2010 | Nakajima | .............. | H04B 1/036 |
| | | | | 320/150 |
| 2010/0143753 A1* | 6/2010 | Kim | .................. | H01M 2/1066 |
| | | | | 429/7 |
| 2012/0140419 A1* | 6/2012 | Ribas | ................ | H05K 7/20454 |
| | | | | 361/714 |
| 2014/0098489 A1* | 4/2014 | Chiriac | .................. | G06F 1/203 |
| | | | | 361/679.54 |

FOREIGN PATENT DOCUMENTS

| | | |
|---|---|---|
| JP | 2000-323186 A | 11/2000 |
| KR | 10-2004-0059384 A | 7/2004 |
| KR | 10-0852589 A | 8/2008 |
| KR | 10-2009-0009911 A | 1/2009 |

\* cited by examiner

PORTABLE ELECTRONIC DEVICE AND BATTERY PACK FOR THE SAME

CROSS-REFERENCE TO RELATED APPLICATION(S)

This application claims the benefit under 35 U.S.C. §119 (a) of a Korean patent application filed on Sep. 17, 2013 in the Korean Intellectual Property Office and assigned Serial number 10-2013-0111493, the entire disclosure of which is hereby incorporated by reference.

TECHNICAL FIELD

The present disclosure relates to a portable electronic device. More particularly, the present disclosure relates to a battery pack for a portable electronic device that reduces a temperature of an overheating portion by reducing a partial overheating phenomenon occurring in the portable electronic device.

BACKGROUND

Nowadays, portable electronic devices gradually have a small thickness and size, and in order to satisfy a user demand, various multimedia functions, such as a moving picture reproduction, an audiovisual communication, an Internet search, game playing, and the like, are added to the portable electronic devices. Therefore, it is difficult for the portable electronic device to secure internal space for mounting several components for embodying a multi-function. In order to reduce a thickness of the portable electronic device, an upper portion, a lower portion, a left portion, and a right portion of a terminal are divided into and used as a space for a battery and a Printed Circuit Board (PCB). In this case, heat is integrated according to a position of a PCB that mounts heat emitting electronic components. Accordingly, heat of the portable electronic device is transferred to a user, and the user experiences an unpleasant feel.

Therefore, in order to reduce power consumption, an enhancement, such as a selection of low power components and optimization of a circuit design, is performed, but much difficulty exists in a component cost and design technology.

Like most electronic products, a portable electronic device has a heat resisting temperature, and when a temperature of the portable electronic device exceeds a specific temperature, the portable electronic device causes a problem, and for example, when a temperature of a semiconductor component rises, a consumption current increases and thus, the heat level increases, whereby a consumption current further increases and thus a temperature further rises. Therefore, an appropriate heat releasing countermeasure is requested.

Therefore, a need exists for a portable electronic device that reduces a temperature of an overheating portion by reducing a partial overheating phenomenon occurring in the portable electronic device.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a portable electronic device and a battery pack for the portable electronic device that can lower a temperature by preventing a temperature of a portion in which major heating components of a Printed Circuit Board (PCB) are positioned from excessively rising in the portable electronic device by transferring heat integrated at an electronic component, such as the PCB, particularly, an application processor and Power Management IC (PMIC) of the portable electronic device to a battery pack.

In accordance with an aspect of the present disclosure, a portable electronic device is provided. The electronic includes a PCB in which at least one electronic component is disposed, and a battery pack including a heat conductor separately disposed at a gap from the PCB and configured to transfer heat generated in the at least one electronic component to a battery cell.

In accordance with another aspect of the present disclosure, a battery pack for a portable electronic device is provided. The portable electronic includes at least one battery cell, and a thermal conductor configured to transfer heat of an electronic component to the battery cell.

In accordance with another aspect of the present disclosure, a portable electronic device is provided. The portable electronic device includes a PCB, an electronic component disposed at one surface of the PCB, a bracket, a contact thermal conductive member configured to attach the electronic component and the bracket at respective both surfaces thereof to absorb heat generated in the electronic component and to transfer the heat to the bracket, a battery pack separately disposed at a gap from the at least one electronic component and including a battery cell and a thermal conductor, and a thermal conductor configured to absorb heat from the bracket to transfer the heat to the battery cell.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
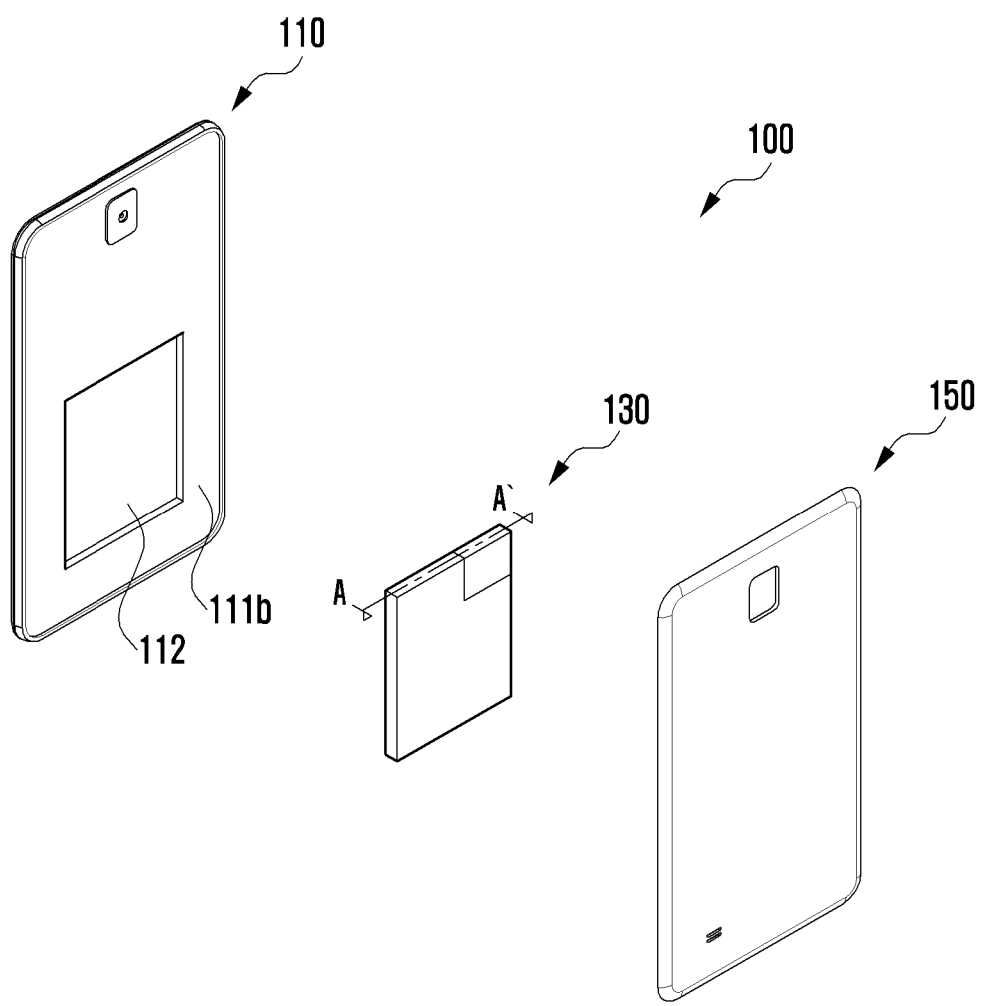
FIG. 1A illustrates a partial perspective view illustrating a portable electronic device that can lower a temperature according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

In an embodiment of the present disclosure, a portable electronic device may include information and communication devices and multimedia devices, such as a digital broadcasting player, Personal Digital Assistant (PDA), smart phone, tablet Personal Computer (PC), and hand-held PC as well as mobile communication terminals operating by communication protocols corresponding to various communication systems, and applications thereof. Hereinafter, in a description, it is assumed that a portable electronic device is a smart phone.

Throughout this specification and the claims that follow, when it is described that an element is "connected" to another element, the element may be "directly connected" to the other element or "electrically connected" to the other element through a third element. In addition, unless explicitly described to the contrary, the word "include" and variations, such as "includes" or "including", will be understood to imply the inclusion of stated elements but not the exclusion of any other elements.

When it is said that any constituent element is 'positioned', it includes a case of contact or close contact as well as a meaning of 'exists'. Further, when it is said that any constituent element is 'vertically' disposed, it includes a case in which the constituent element is curved similarly to vertical as well as a case in which the constituent element is disposed at 90°.

FIG. 1A illustrates a partial perspective view illustrating a portable electronic device that can lower a temperature according to an embodiment of the present disclosure.

Referring to FIG. 1A, a portable electronic device 100 includes a main body 110, battery pack 130, and main body rear cover 150.

In a portion of a rear surface 111b of the main body 110, a first battery mounting portion 112 may be formed. The first battery mounting portion 112 may be space in which that the battery pack 130 may be mounted and separated. The first battery mounting portion 112 may be dented by a size corresponding to a thickness and an area of the battery pack 130.

The battery pack 130 may include a thermal conduction member 131.

When the battery pack 130 is separated from the first battery mounting portion 112 or is mounted in the first battery mounting portion 112, the main body rear cover 150 may be also separated or mounted. When the battery pack 130 is housed in the main body 110, the main body rear cover 150 may not be separated or mounted. Even when the battery pack 130 is housed in the main body 110, the battery pack 130 may include the thermal conduction member 131.

Figure 1B:
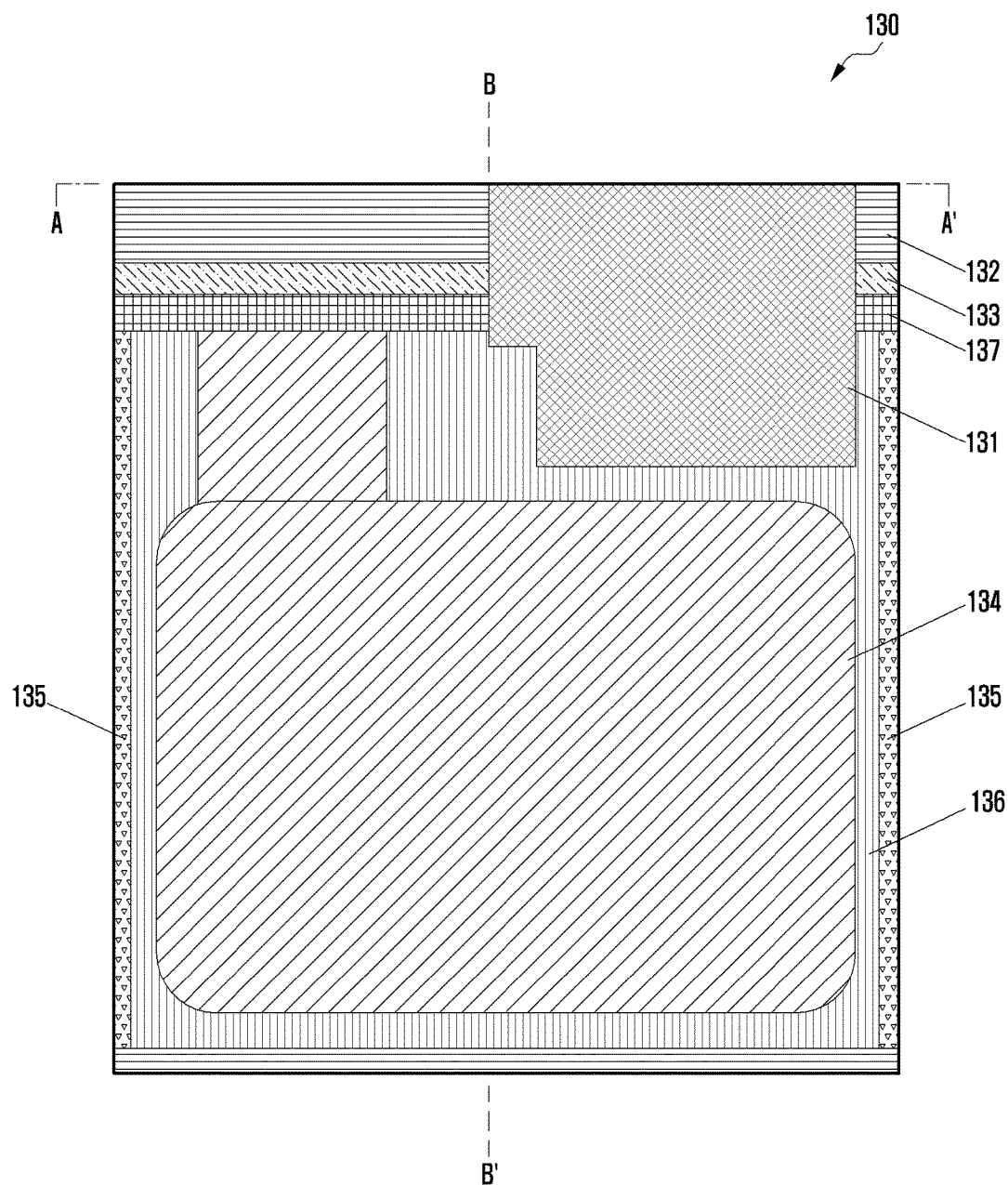
FIG. 1B illustrates a cross-sectional view illustrating a battery pack of a portable electronic device taken along line AA' of FIG. 1 including a Printed Circuit Board (PCB) in which a temperature drop is needed by mounting major heating components according to an embodiment of the present disclosure.

FIG. 1B illustrates a cross-sectional view illustrating a battery pack of a portable electronic device taken along line AA' of FIG. 1 including a Printed Circuit Board (PCB) in which a temperature drop is needed by mounting major heating components according to an embodiment of the present disclosure.

Referring to FIG. 1B, the battery pack 130 may include a thermal conduction member 131, a battery case 132, a battery protection circuit 133, an NFC antenna pack 134, a housing 135, a battery cell 136, and a case holder 137.

The thermal conduction member 131 may be attached to a portion of each of the battery case 132, the battery protection circuit 133, the case holder 137, and a rear surface 309 of the battery cell 136. The thermal conduction member 131 may be made of a material having excellent thermal conductivity, such as Aluminum (Al), Copper (Cu), Graphite, and Boron Nitride (BN) or a mixture thereof. The thermal conduction member 131 may have the same thickness as or a thickness smaller than that of the NFC antenna pack 134.

The battery case 132 may be made of a material, such as PolyCarbonate PC. A material of a generally used battery case 132 does not have high thermal conductivity.

The battery protection circuit 133 may be positioned at an upper surface of the case holder 137. The battery protection circuit 133 may protect the battery cell 136 from overcharge and overcurrent and prevent performance deterioration due to over-discharge.

The NFC antenna pack 134 includes an NFC antenna circuit 1034 and is a kind of Radio Frequency Identification (RFID). The NFC antenna circuit 1034 may be used for a non-contact short range communication module using a frequency band of 13.56 MHz. The NFC antenna circuit 1034 may be formed with a flexible PCB, which is a kind of a PCB. The NFC antenna pack 134 may be attached in the rear surface 309 of the battery cell 136.

The housing 135 may enclose the entire or some of the outside of the battery pack 130.

The battery cell 136 is a rechargeable battery that can be charged and may be produced in various forms, such as a nickel battery, cadmium battery, nickel-cadmium battery, lithium ion battery, lithium polymer battery, chemical battery, and the like. The battery cell 136 may supply power to each element of the portable electronic device 100.

The case holder 137 may be made of a material, such as PC. A material of a generally used case holder 137 has low thermal conductivity.

Figure 2:
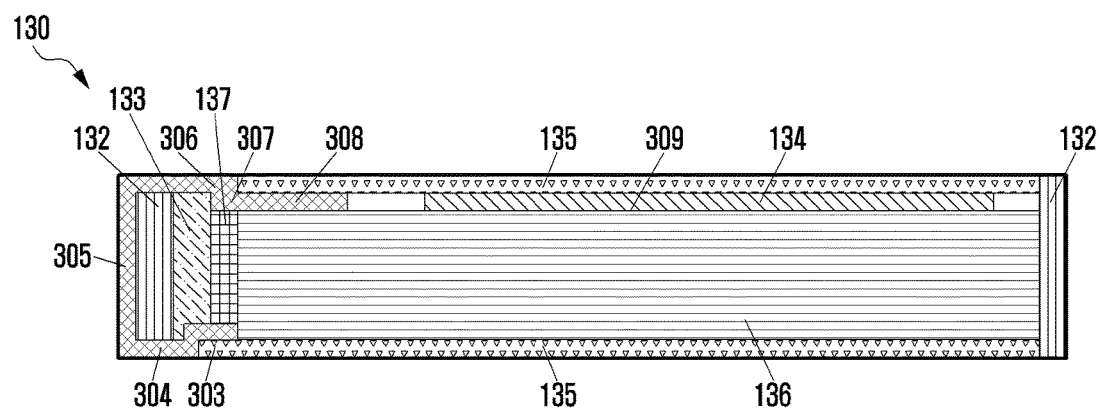
FIG. 2 illustrates a cross-sectional view illustrating a battery pack taken along line BB' of FIG. 1B according to an embodiment of the present disclosure.

FIG. 2 is a cross-sectional view illustrating a battery pack taken along line BB' of FIG. 1B according to an embodiment of the present disclosure.

Referring to FIG. 2, the thermal conduction member 131 may include a lower end thermal conduction portion 304, exposure portion 305, heat transmitting portion 306, and contact portion 308.

The thermal conduction member 131 may include a bent portion 307 and a fixing portion 303 so as to close contact with a circumference of a portion including the inside and outside of the battery pack 130. The thermal conduction member 131 may be made of an injection material.

The fixing portion 303 of the thermal conduction member 131 may be attached to the housing 135 of a portion of the battery pack 130 and may be attached to a portion of the case holder 137 and the battery protection circuit 133.

Further, one surface of the fixing portion 303 may be attached to another surface of the housing 135. Another surface of the fixing portion 303 of the thermal conduction member 131 may be attached to one surface of the case holder 137 and one surface of the battery protection circuit 133. In order to close contact the thermal conduction member 131 with the battery pack 130 and to fix the thermal conduction member 131 to the battery pack 130, the fixing portion 303 may include a bent surface.

The lower end thermal conduction portion 304 may be attached to a portion of the battery case 132. A portion of the lower end thermal conduction portion 304 may be positioned at a portion of the battery protection circuit 133 and a portion of the battery case 132. The lower end thermal conduction portion 304 may be exposed to receive heat from another external component and to transfer heat to another portion of the thermal conduction member 131.

An end portion of the exposure portion 305 may be vertically connected to an end portion of the lower end thermal conduction portion 304. The exposure portion 305 may be attached to one surface of the battery case 132.

The heat transmitting portion 306 may be vertically connected to a portion of the exposure portion 305. The heat transmitting portion 306 may be positioned at a portion of the battery case 132 and one surface of the battery protection circuit 133. The heat transmitting portion 306 may perform a function of transferring heat from the exposure portion 305 to the battery cell rear surface 309.

The bent portion 307 may be attached between the case holder 137 and the housing 135 of a portion of the battery pack 130. Further, a portion of the bent portion 307 may be attached to a portion of the case holder 137 and a portion of the battery cell rear surface 309.

The contact portion 308 may be connected to an end portion of the bent portion 307. The contact portion 308 may be positioned at a portion of the battery cell rear surface 309 and the housing 135 of a portion of the battery pack 130. A portion of the contact portion 308 may be attached to one surface of the battery cell rear surface 309. A portion of the contact portion 308 may be positioned at a portion of the housing 135 of a portion of the battery pack.

Figure 3:
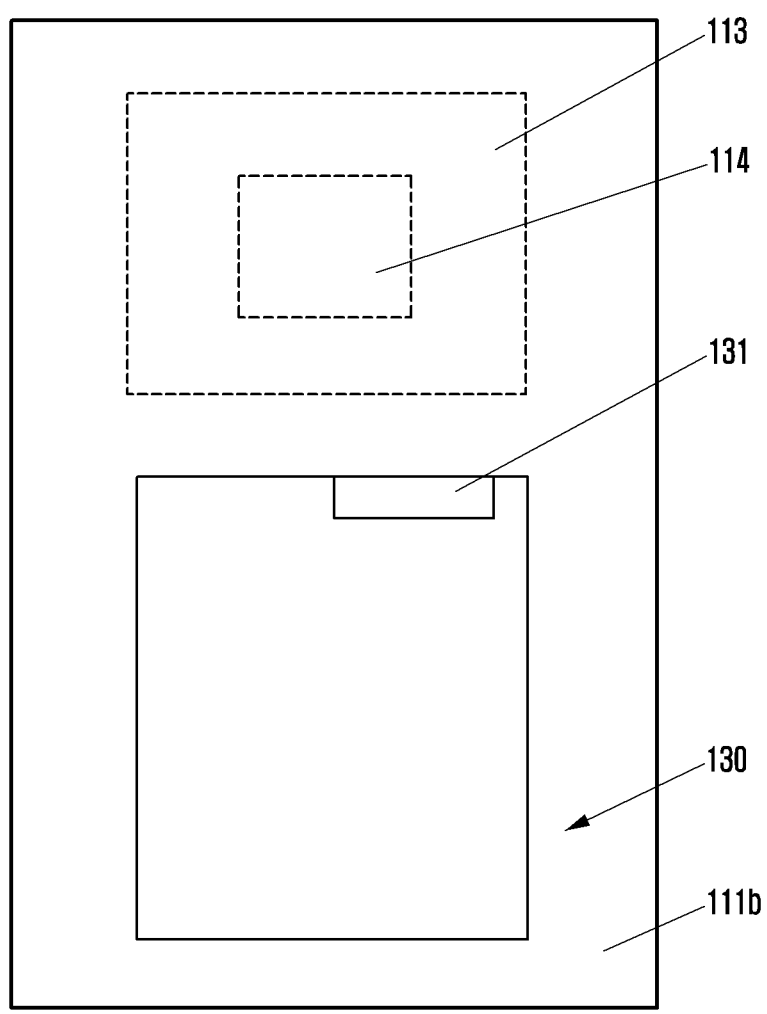
FIG. 3 illustrates a rear view illustrating a main body of a portable electronic device including a PCB in which a temperature drop is needed by mounting major heating components according to an embodiment of the present disclosure.

FIG. 3 illustrates a rear view illustrating a main body of a portable electronic device including a PCB in which a temperature drop is needed by mounting major heating components according to an embodiment of the present disclosure.

Referring to FIG. 3, the portable electronic device 100 may include a PCB 113 and an electronic component 114 as well as the battery pack 130. The electronic component 114 may be attached to the PCB 113. The electronic component 114 may be, for example an Application Processor (AP) and a Power Management IC (PMIC). The battery pack 130 may be separately disposed at a gap from the PCB 113.

Figure 4:
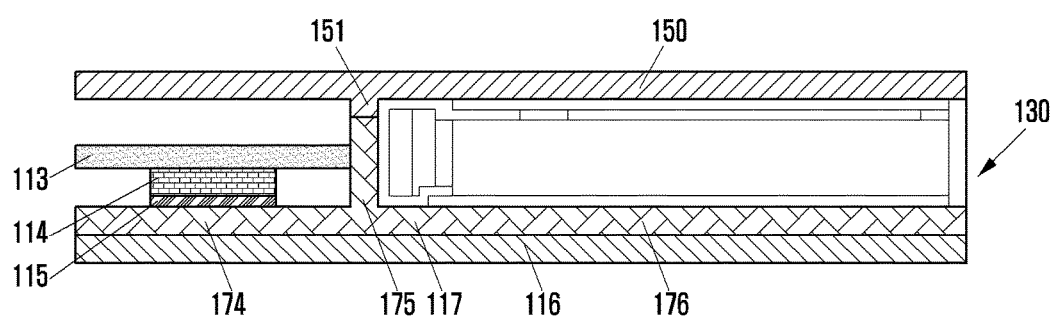
FIG. 4 illustrates a longitudinal cross-sectional view illustrating a portable electronic device including a PCB in which a temperature drop is needed by mounting major heating components according to an embodiment of the present disclosure.

FIG. 4 illustrates a longitudinal cross-sectional view illustrating a portable electronic device including a PCB in which a temperature drop is needed by mounting major heating components according to an embodiment of the present disclosure.

Referring to FIG. 4, the portable electronic device 100 may include a first contact thermal conduction member 115, display device 116, and bracket 117.

The first contact thermal conduction member 115 is referred to as a Thermal Interface Material (TIM) and may be mounted between a heat emitting component, such as a Central Processing Unit (CPU), an IC Package, a TR, the PCB 113, an LED and a heat releasing plate (i.e., a heat sink, cooling device, and metal case). The first contact thermal conduction member 115 is referred to as an interface material of a function of conducting and emitting heat of an electronic component. The first contact thermal conduction member 115 may be additionally attached to the electronic component 114. The first contact thermal conduction member 115 is positioned at an electronic component mounting portion 174 of the bracket 117 to transfer heat of the electronic component 114 via the bracket 117.

One surface of the display device 116 may be attached to one surface of the bracket 117. The display device 116 may perform a function of a user interface that outputs a desired screen to a user or that receives a command from a user. Such a display device 116 may use a Liquid Crystal Display (LCD), Organic Light Emitting Diodes (OLED), Thin Film Transistor (TFT), Electrophoretic, and Laser Induced Thermal Image (LITI) technology. The LCD is an electronic element that changes and transfers several electrical information generated in various apparatuses to visual information using a change of transmittance of liquid crystal according to an applied voltage. Further, the OLED is a self-luminescent organic material that emits light using a field light emitting phenomenon that emits light when a current flows to a fluorescent organic compound. In order to receive an input of a command from a user, the display device 116 may perform a function of a touch screen.

The bracket 117 may include the electronic component mounting portion 174, a division protruded portion 175, and a second battery mounting portion 176. The bracket 117 may be made of a material, such as metal having high thermal conductivity.

In the electronic component mounting portion 174 of the bracket 117, the PCB 113, the electronic component 114, and the first contact thermal conduction member 115 may be attached to a portion of the electronic component mounting portion 174.

The division protruded portion 175 of the bracket 117 may be positioned between the PCB 113 and the battery pack 130. The division protruded portion 175 of the bracket 117 may be protruded to increase an area contacting with the PCB 113 and the battery pack 130. Further, the division protruded portion 175 of the bracket 117 may structurally divide space of the PCB 113 and space of the battery pack 130. A portion of the division protruded portion 175 of the bracket 117 may contact with one surface of an internal protruded portion 151 positioned at an intermediate portion of the main body rear cover 150.

The second battery mounting portion 176 may be positioned between a portion of the battery pack 130 and a portion of the display device 116. The second battery mounting portion 176 may be positioned at the battery pack 130 that may include a thermal conductor.

The battery pack 130 may be positioned between the second battery mounting portion 176 of the bracket 117 and a portion of the main body rear cover 150.

Figure 5:
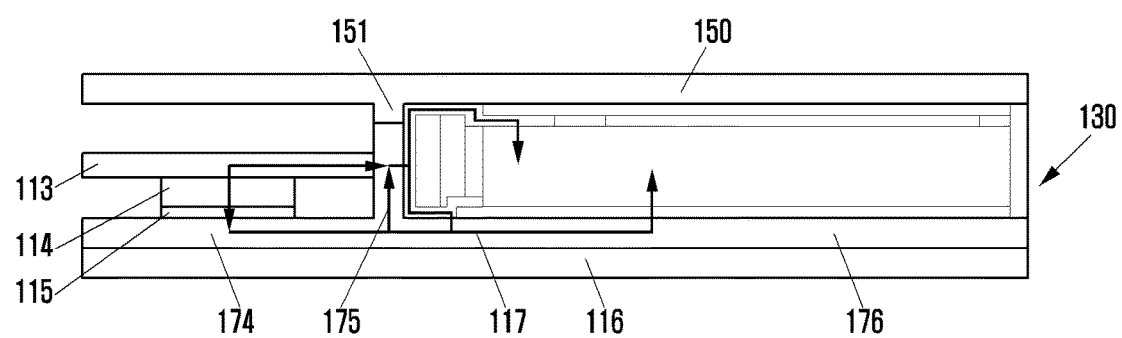
FIG. 5 illustrates a diagram illustrating heat flow of a portable electronic device according to an embodiment of the present disclosure.

FIG. 5 illustrates a diagram illustrating heat flow of a portable electronic device according to an embodiment of the present disclosure.

Referring to FIG. 5, heat of the electronic component 114 mounted in the PCB 113 may be transferred to the division protruded portion 175 of the bracket 117. Further, heat of the electronic component 114 may be transferred to the first contact thermal conduction member 115. The heat transferred to the first contact thermal conduction member 115 may be transferred to the second battery mounting portion 176 of the bracket 117 and the division protruded portion 175 of the bracket 117 via the electronic component mounting portion 174 of the bracket 117. The heat transferred to the second battery mounting portion 176 of the bracket 117 may be transferred to the exposure portion 305 of the thermal conduction member 131 through the lower end thermal conduction portion 304 of the thermal conduction member 131. The heat transferred to the exposure portion 305 of the thermal conduction member 131 may be transferred to the contact portion 308 of the thermal conduction member 131 via the heat transmitting portion 306 of the thermal conduction member 131 and may be thus transferred to the battery cell 136. Further, the heat transferred to the second battery mounting portion 176 of the bracket 117 may be transferred to the battery cell 136 or may be transferred to the battery cell 136 via the fixing portion 303 of the thermal conduction member 131.

By enabling heat integrated at the electronic component 114 mounted in the PCB 113 through the thermal conduction member 131 to be transferred to the battery cell 136, a locally raised temperature by a major heating component of the PCB 113 may be lowered.

An effect of the thermal conduction member 131 using a thermal conductivity formula is described.

$$Q = -K \times A\left(\frac{\Delta T}{L}\right) \quad (1)$$

Q=heat flow (W)
K=thermal conductivity (W/mk)
A=sample area (m$^2$)
L=sample thickness (m)
ΔT=temperature difference (the same as K,)
Equation 1 may be changed to Equation 2.

$$\Delta T = -\frac{Q}{KA} \times L \quad (2)$$

In Equation 2, when the heat flow, sample area, and sample thickness are fixed to a fixed value, it can be seen that thermal conductivity and a temperature difference are inversely proportional. The temperature difference indicates a temperature difference between a conduction portion and a portion to be conducted when thermal conduction is started. As heat flows due to a temperature difference, thermal conduction occurs.

For example, before using the thermal conduction member 131, the portable electronic device 100 could conduct heat using the bracket 117. When a temperature difference of the bracket 117 is 10° C., a temperature difference when using the thermal conduction member 131 made of a material having relatively high thermal conductivity may be 5° C. smaller than 10° C. For example, by reducing a temperature difference ΔT inversely proportional to thermal conductivity K, even if a temperature of the electronic component 114 rises a little, heat of the electronic component 114 may be easily conducted to the battery cell 136. By attaching the thermal conduction member 131 having high thermal conductivity, heat of the electronic component 114 can be more easily transferred to the battery cell 136.

Figure 6:
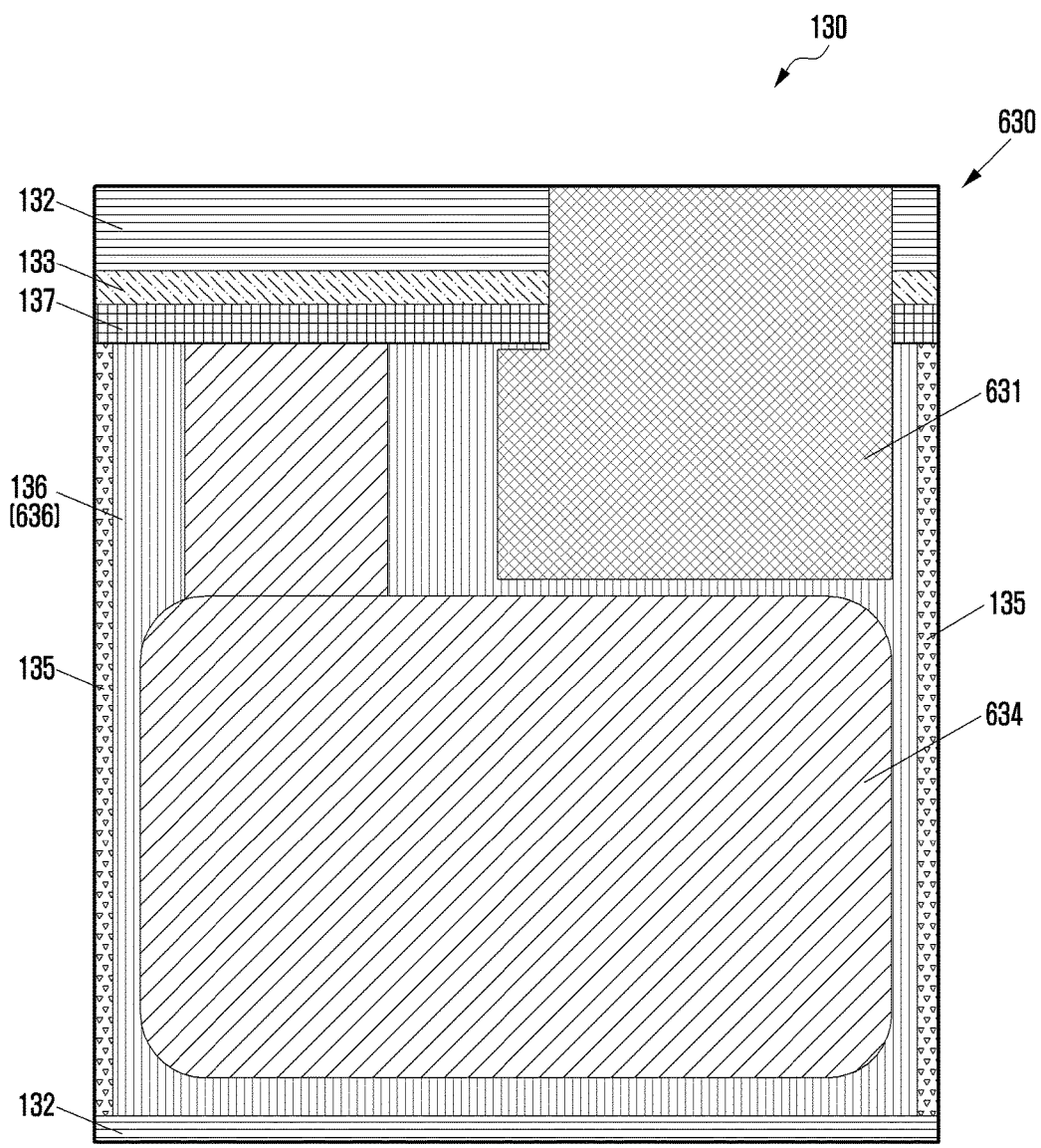
FIG. 6 illustrates a transverse cross-sectional view illustrating a battery pack of a portable electronic device including a PCB in which a temperature drop is needed by mounting major heating components according to an embodiment of the present disclosure.

FIG. 6 illustrates a transverse cross-sectional view illustrating a battery pack of a portable electronic device including a PCB in which a temperature drop is needed by mounting major heating components according to an embodiment of the present disclosure.

Referring to FIG. 6, an area of a battery pack 630 can be enlarged due to volume increase of the battery pack 630, unlike a case of FIG. 1B. An NFC antenna pack 634 can change a position thereof within the battery pack 630. Further, a battery cell 636 can change a position and a size thereof within the battery pack 630. An area of a thermal conduction member 631 adjacent to the battery cell 636 increases due to the NFC antenna pack 634 having a changed size and thus thermal conduction can be easily performed.

In this case, the thermal conduction member 631 may have the same thickness as or a thickness smaller than that of the NFC antenna pack 634, and a thickness of the battery pack 630 does not increase due to attachment of the thermal conduction member 631.

Figure 7:
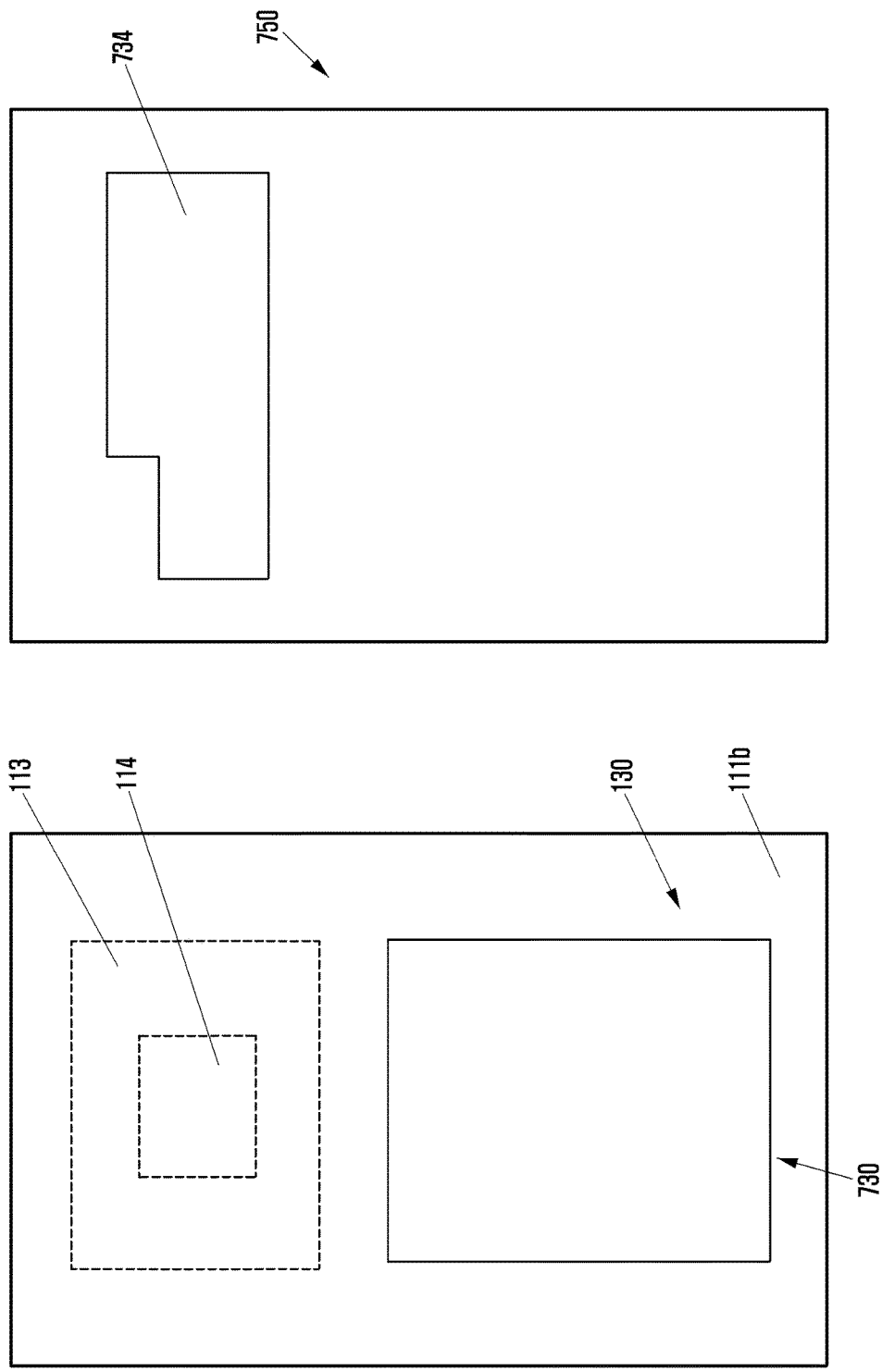
FIG. 7 illustrates a main body rear cover and a rear view of a main body of a portable electronic device including a PCB in which a temperature drop is needed by mounting major heating components according to an embodiment of the present disclosure.

FIG. 7 illustrates a main body rear cover and a rear view of a main body of a portable electronic device including a PCB in which a temperature drop is needed by mounting major heating components according to an embodiment of the present disclosure.

Referring to FIG. 7, a main body rear cover 750 may include an NFC antenna pack 734. At the inside of a battery pack 730, the thermal conduction member 131 having restriction of a size and a position due to the NFC antenna pack 734 may be attached to the entire or some of the inside and the outside of a battery pack 730.

Accordingly, because an area of the thermal conduction member 131 contacting with the battery cell 136 may be increased without restriction, thermal conduction to the battery cell 136 can be more easily performed.

Figure 8A:
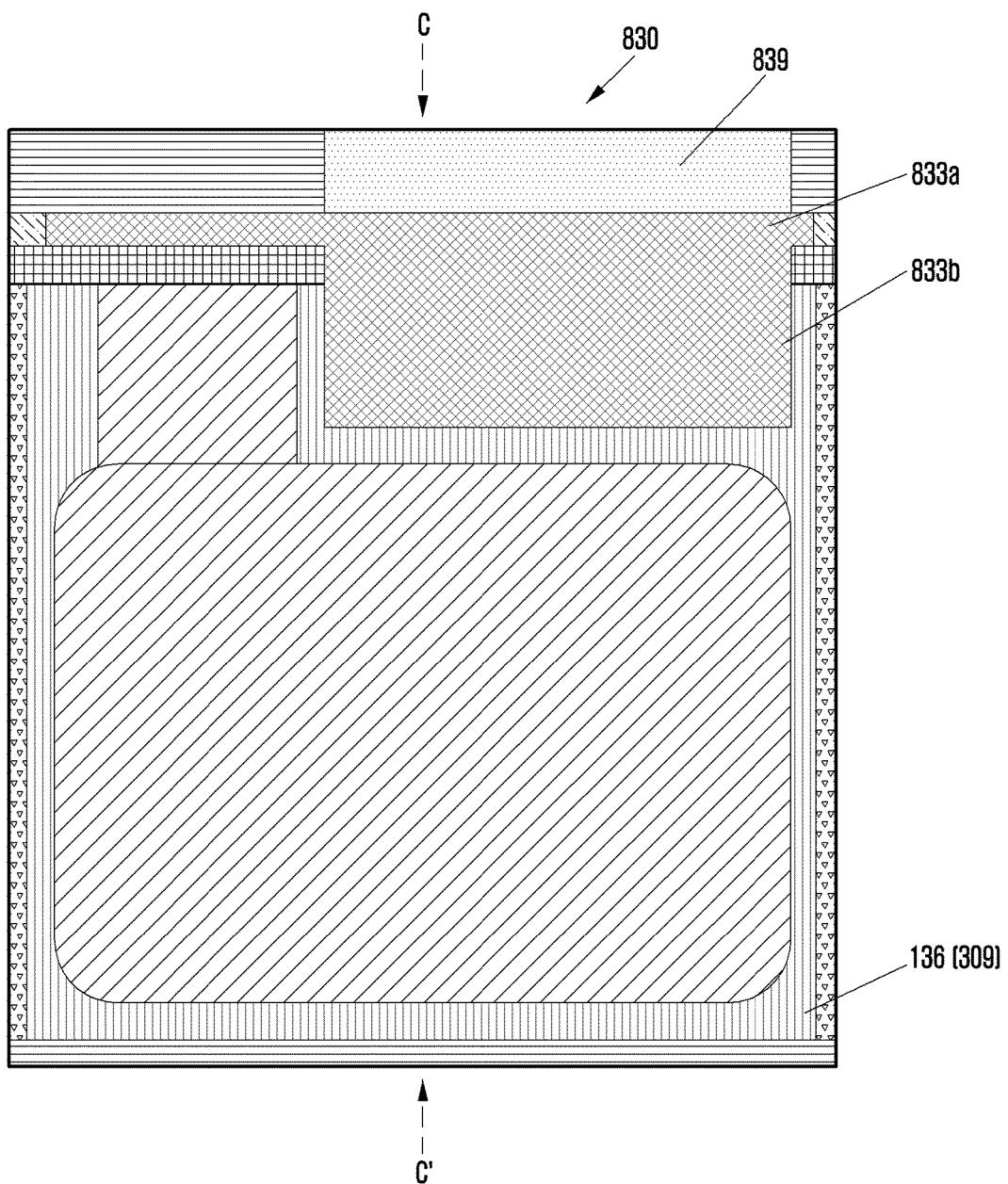
FIG. 8A illustrates a transverse cross-sectional view illustrating a battery pack of a portable electronic device including a PCB in which a temperature drop is needed by mounting major heating components according to an embodiment of the present disclosure.

FIG. 8A illustrates a transverse cross-sectional view illustrating a battery pack of a portable electronic device including a PCB in which a temperature drop is needed by mounting major heating components according to an embodiment of the present disclosure.

Referring to FIG. 8A, unlike a case of FIG. 1B, by performing thermal conduction using a battery protection circuit 833, in a battery pack 830, the thermal conduction member 131 may not exist. Further, the battery pack 830 may further include a first conductive structure 839.

The battery protection circuit 833 may conduct heat instead of the thermal conduction member 131 by changing a material. A material of the battery protection circuit 833 may be changed to a material of a rigid flexible PCB instead of a material of a general PCB. The rigid flexible PCB is a multi-layer board having a rigid portion that mounts a component and a flexible portion that can be bent. By changing a material of the battery protection circuit 833 to a material of the rigid flexible PCB, a thermal conduction characteristic of the battery protection circuit 833 can be improved. The battery protection circuit 833 may include a rigid battery protection circuit 833a and a flexible battery protection circuit 833b. The battery protection circuit 833 may be positioned at an upper portion of the battery pack 830.

The first conductive structure 839 may be made of a material, such as copper having high thermal conductivity. The first conductive structure 839 may be surface mounted in at least one of the rigid battery protection circuit 833a and the flexible battery protection circuit 833b.

Figure 8B:
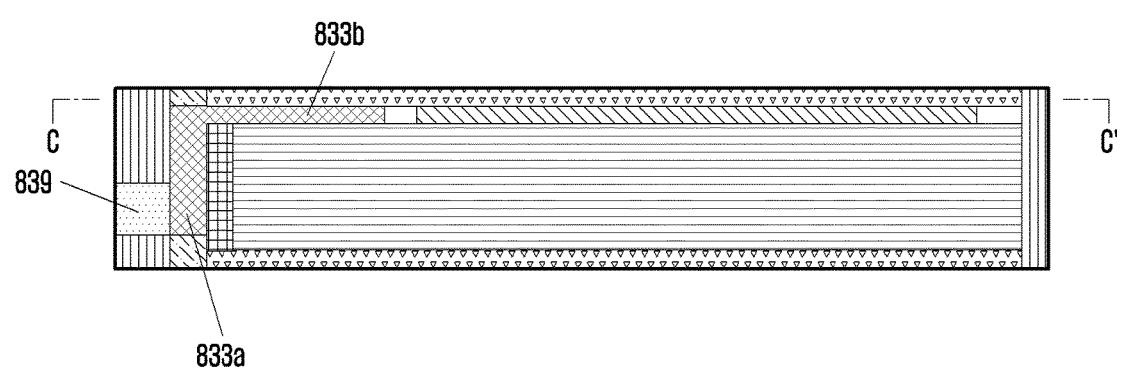
FIG. 8B illustrates a cross-sectional view illustrating a battery pack taken along line CC' of FIG. 8A according to an embodiment of the present disclosure.

FIG. 8B illustrates a cross-sectional view illustrating a battery pack taken along line CC' of FIG. 8A according to an embodiment of the present disclosure.

Referring to FIG. 8B, the rigid battery protection circuit 833a may be positioned between the battery case 132 and the case holder 137. The flexible battery protection circuit 833b may be vertically connected to the rigid battery protection circuit 833a. The flexible battery protection circuit 833b may be positioned at one surface of the case holder 137 and one surface of the battery cell rear surface 309. The flexible battery protection circuit 833b may be separately positioned at a gap from the NFC antenna pack 134.

Figure 9:
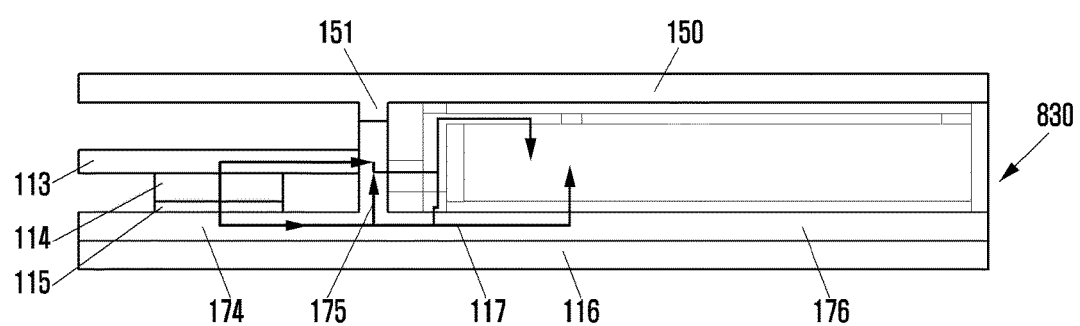
FIG. 9 illustrates a diagram illustrating heat flow of a portable electronic device according to an embodiment of the present disclosure.

FIG. 9 illustrates a diagram illustrating heat flow of a portable electronic device according to an embodiment of the present disclosure.

Referring to FIG. 9, heat of the electronic component 114 positioned at the PCB 113 may be transferred to the division protruded portion 175 of the bracket 117. Further, heat of the electronic component 114 may be transferred to the first contact thermal conduction member 115. The heat transferred to the first contact thermal conduction member 115 may be transferred to the division protruded portion 175 of the bracket 117 and the second battery mounting portion 176 of the bracket 117 via the electronic component mounting portion 174 of the bracket 117.

The heat transferred to the division protruded portion 175 of the bracket 117 may be transferred to the first conductive structure 839 positioned at the battery pack 830. The heat transferred to the first conductive structure 839 may be transferred to the battery cell 136 via the rigid battery protection circuit 833a and the flexible battery protection circuit 833b.

The heat transferred to the battery mounting portion 176 of the bracket 117 may be transferred to the battery cell 136.

The battery cell 136 may absorb heat through the first conductive structure 839 and a battery protection circuit 833 and reduce an integrated heat of the electronic component 114 mounted in the PCB 113.

The battery protection circuit 833 made of a material having high thermal conductivity becomes a thermal conductor to perform a function of the thermal conduction member 131 shown in FIG. 1B. Further, the first conductive structure 839 made of a material having high thermal conductivity becomes a thermal conductor to perform a function of the thermal conduction member 131 shown in FIG. 1B.

Referring to Equation 2, due to the battery protection circuit 833 and the first conductive structure 839, thermal conductivity K may increase. For example, by reducing a temperature difference $\Delta T$ inversely proportional to thermal conductivity K, even if a temperature of the electronic component 114 rises a little, heat of the electronic component 114 can be easily conducted to the battery cell 136. By attaching the battery protection circuit 833 having high thermal conductivity and the first conductive structure 839, heat of the electronic component 114 can be more easily transferred to the battery cell 136.

Figure 10A:
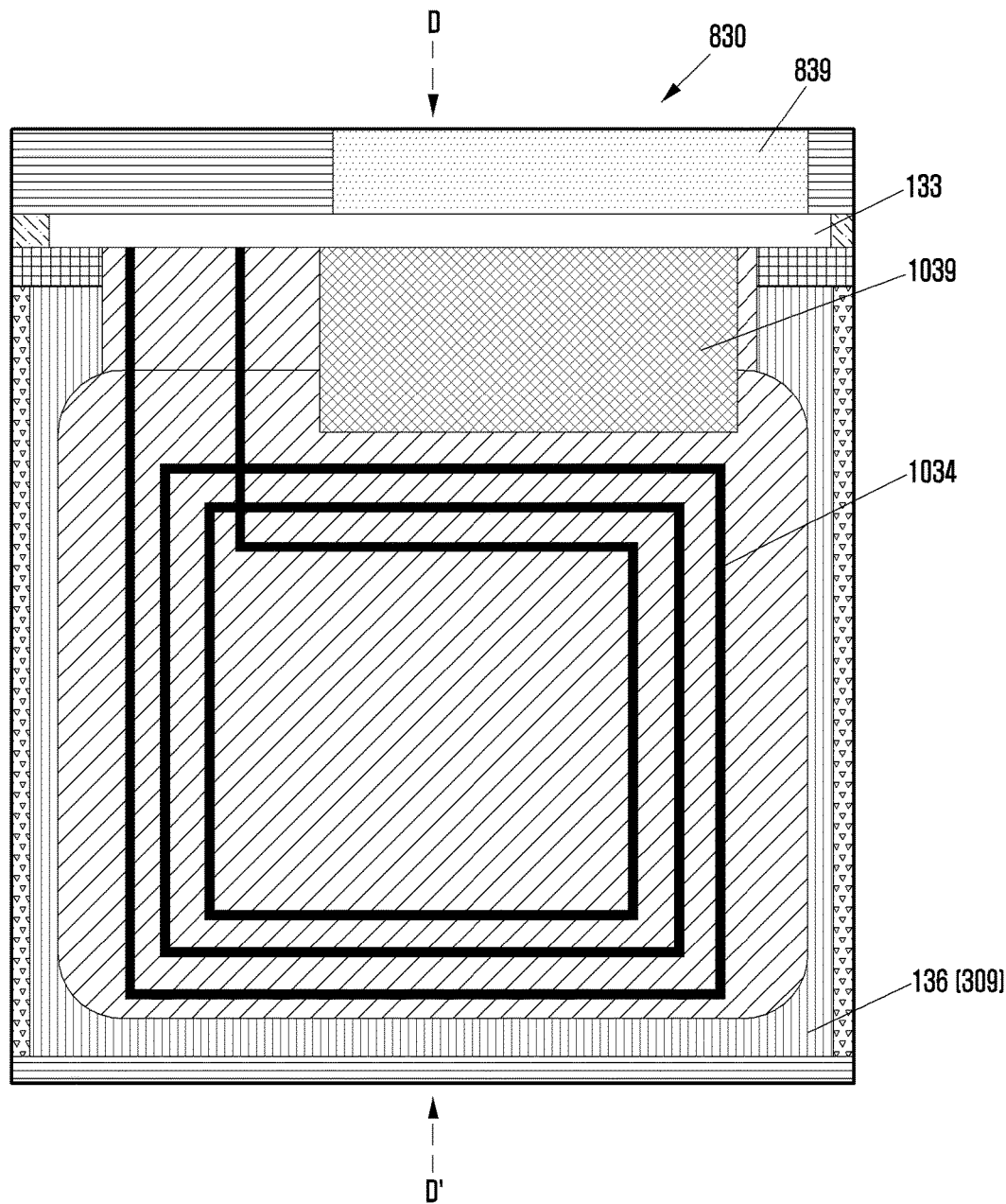
FIG. 10A illustrates a transverse cross-sectional view illustrating a battery pack of a portable electronic device including a PCB in which a temperature drop is needed by mounting major heating components according to an embodiment of the present disclosure.

FIG. 10A is a transverse cross-sectional view illustrating a battery pack of a portable electronic device including a PCB in which a temperature drop is needed by mounting major heating components according to an embodiment of the present disclosure.

Referring to FIG. 10A, unlike a case of FIG. 8A, a battery pack 1030 may include an NFC antenna circuit 1034 to which the second conductive structure 1039 is added.

The NFC antenna pack 134 may be attached to a portion of the battery cell rear surface 309. The NFC antenna circuit 1034 may be formed with an F PCB.

The first conductive structure 839 may be surface-mounted in the battery protection circuit 133. The second conductive structure 1039 made of a material having high thermal conductivity, such as copper in the first conductive structure 839 may be added within the NFC antenna pack 134.

The second conductive structure 1039 may be positioned between one surface of the NFC antenna pack 134 and one surface of the battery protection circuit 133 or may close contact with one surface of the NFC antenna pack 134 and one surface of the battery protection circuit 133. The second conductive structure 1039 may not be overlapped with the NFC antenna circuit 1034 of the NFC antenna pack 134.

Figure 10B:
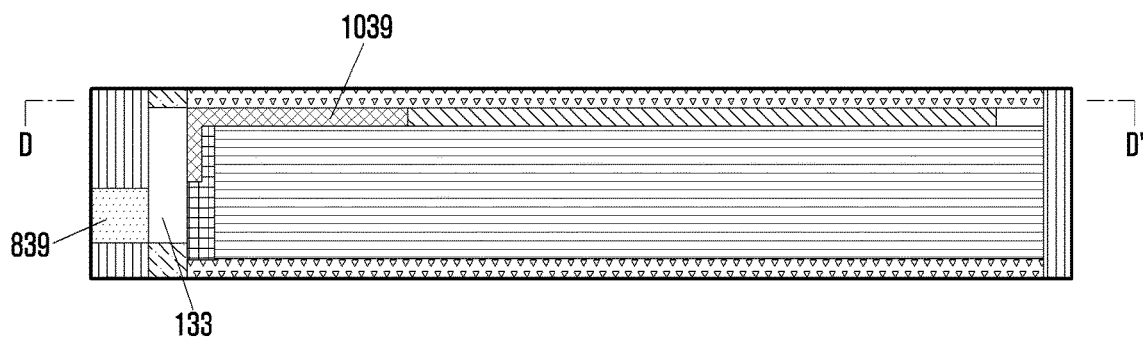
FIG. 10B illustrates a cross-sectional view illustrating a battery pack taken along line DD' of FIG. 10A according to an embodiment of the present disclosure.

FIG. 10B illustrates a cross-sectional view illustrating a battery pack taken along line DD' of FIG. 10A according to an embodiment of the present disclosure.

Referring to FIG. 10B, the second conductive structure 1039 may be positioned at a portion of the battery case 132 and be surface-mounted in the battery protection circuit 133.

The battery protection circuit 133 may be positioned between the battery case 132 and the case holder 137. The battery protection circuit 133 may be an F PCB.

The second conductive structure 1039 may be made of a material having excellent thermal conductivity. The second conductive structure 1039 may be vertically bent at a gap. A portion of the second conductive structure 1039 may be positioned between the battery protection circuit 133 and the case holder 137. A portion of the second conductive structure 1039 may contact with a portion of a side surface of the battery protection circuit 133 and a portion of a side surface of the case holder 137. Another bent portion of the second conductive structure 1039 may be positioned at a portion of the case holder 137 and a portion of the battery cell rear surface 309. A bent portion of the second conductive structure 1039 may contact with a portion of the case holder 137 and one surface of the battery cell rear surface 309. The second conductive structure 1039 may be positioned within the NFC antenna pack 134. The second conductive structure 1039 may not be positioned at the NFC antenna circuit 1034 of the NFC antenna pack 134.

Figure 11:
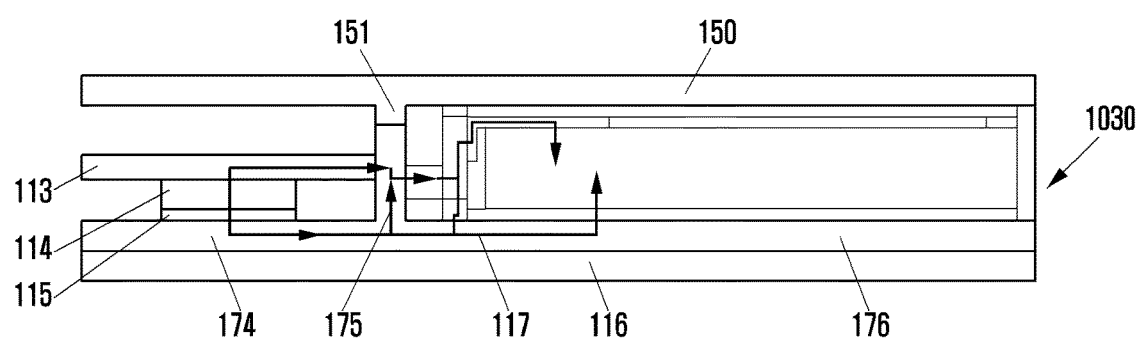
FIG. 11 illustrates a diagram illustrating heat flow of a portable electronic device according to an embodiment of the present disclosure.

FIG. 11 illustrates a diagram illustrating heat flow of a portable electronic device according to an embodiment of the present disclosure.

Referring to FIG. 11, heat of the electronic component 114 attached to the PCB 113 may be transferred to the division protruded portion 175 of the bracket 117. Further, heat of the electronic component 114 may be transferred to the first contact thermal conduction member 115. The heat transferred to the first contact thermal conduction member 115 may be transferred to the division protruded portion 175 of the bracket 117 and the second battery mounting portion 176 of the bracket 117 via the electronic component mounting portion 174 of the bracket 117. The heat transferred to the division protruded portion 175 of the bracket 117 may be transferred to the battery protection circuit 133 via the first conductive structure 839. The heat transferred to the second battery mounting portion 176 may be transferred to the battery protection circuit 133 and the battery cell 136. The heat transferred to the battery protection circuit 133 may be transferred to the battery cell 136 via the second conductive structure 1039. The battery cell 136 may absorb heat through the first conductive structure 839 and the second conductive structure 1039 surface-mounted in the battery protection circuit 133 and reduce an integrated heat of the electronic component 114 mounted in the PCB 113.

The first conductive structure 839 made of a material, such as copper having high thermal conductivity becomes a thermal conductor to perform a function of the thermal conduction member 131 shown in FIG. 1B. Further, the second conductive structure 1039 made of a material having high thermal conductivity becomes a thermal conductor to perform a function of the thermal conduction member 131 shown in FIG. 1B.

Referring to Equation 2, due to the first conductive structure 839 and the second conductive structure 1039, thermal conductivity K may increase. For example, by reducing a temperature difference ΔT inversely proportional to thermal conductivity K, even if a temperature of the electronic component 114 rises a little, heat of the electronic component 114 may be easily conducted to the battery cell 136. By attaching the first conductive structure 839 and the second conductive structure 1039 having high thermal conductivity, heat of the electronic component 114 can be more easily transferred to the battery cell 136.

Figure 12A:
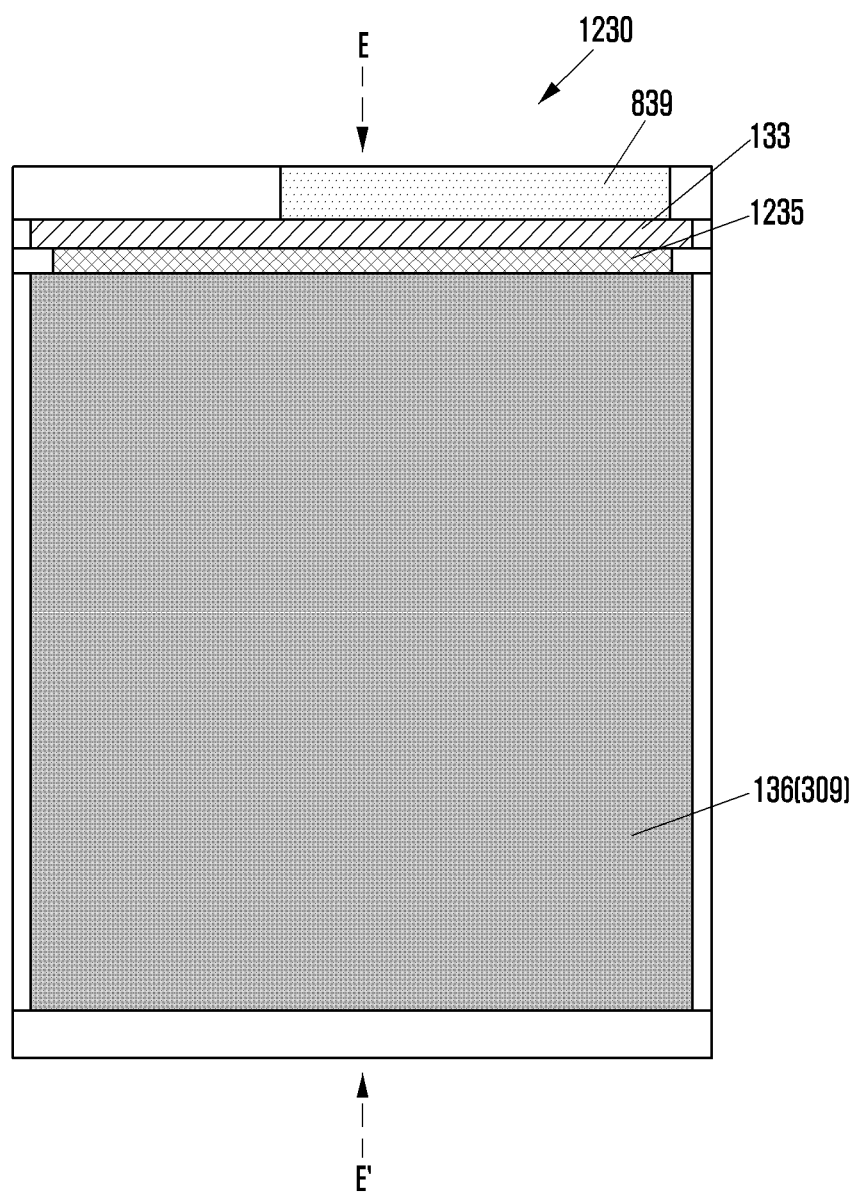
FIG. 12A illustrates a transverse cross-sectional view illustrating a battery pack of a portable electronic device including a PCB in which a temperature drop is needed by mounting major heating components according to an embodiment of the present disclosure.

FIG. 12A illustrates a transverse cross-sectional view illustrating a battery pack of a portable electronic device including a PCB in which a temperature drop is needed by mounting major heating components according to an embodiment of the present disclosure.

Referring to FIG. 12A, unlike the battery pack 730 of FIG. 7, the battery pack 1230 may include a second contact thermal conduction member 1235.

The second contact thermal conduction member 1235 may be positioned within the case holder 137 positioned between the battery protection circuit 133 and the battery cell 136. The first conductive structure 839 may be surface mounted in the battery protection circuit 133.

Figure 12B:
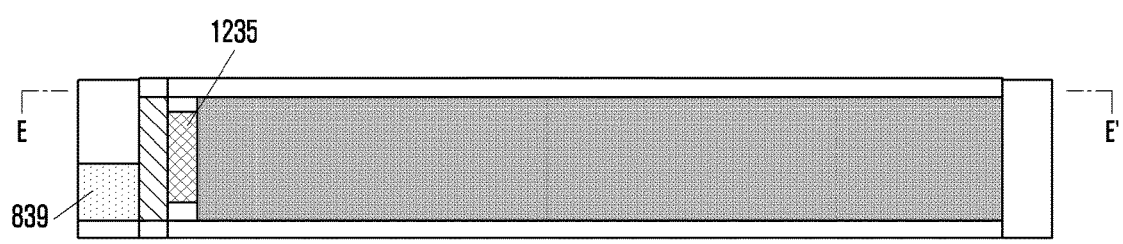
FIG. 12B illustrates a cross-sectional view illustrating a battery pack taken along line EE' of FIG. 12A according to an embodiment of the present disclosure.

FIG. 12B illustrates a cross-sectional view illustrating a battery pack taken along line EE' of FIG. 12A according to an embodiment of the present disclosure.

Referring to FIG. 12B, the first conductive structure 839 is positioned at the battery case 132 and may be surface mounted in the battery protection circuit 133. The second contact thermal conduction member 1235 may be positioned within the case holder 137 positioned between the battery protection circuit 133 and the battery cell 136. The second contact thermal conduction member 1235 may contact with a portion of the battery case 132 and one surface of the battery cell 136.

Figure 13:
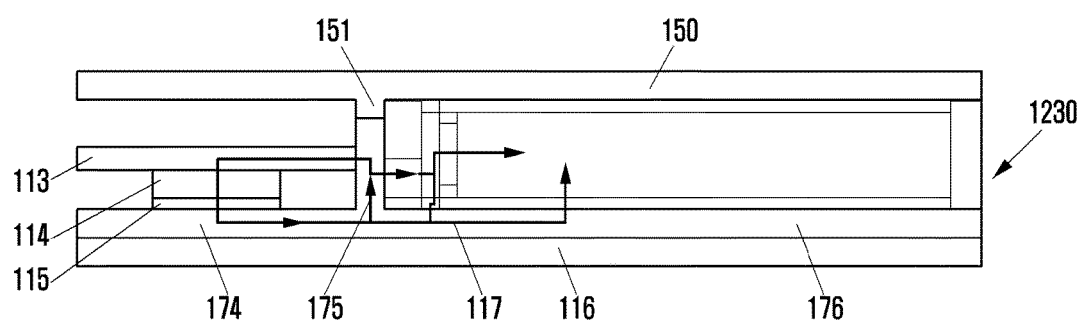
FIG. 13 illustrates a diagram illustrating heat flow of a portable electronic device according to an embodiment of the present disclosure.

FIG. 13 illustrates a diagram illustrating heat flow of a portable electronic device according to an embodiment of the present disclosure.

Referring to FIG. 13, heat of the electronic component 114 attached to the PCB 113 may be transferred to the division protruded portion 175 of the bracket 117. Further, heat of the electronic component 114 may be transferred to the first contact thermal conduction member 115. The heat transferred to the first contact thermal conduction member 115 may be transferred to the division protruded portion 175 of the bracket 117 and the second battery mounting portion 176 of the bracket 117 via the electronic component mounting portion 174 of the bracket 117. The heat transferred to the division protruded portion 175 of the bracket 117 may be transferred to the battery protection circuit 133 via the first conductive structure 839. The heat transferred to the second battery mounting portion 176 of the bracket 117 may be transferred to the battery protection circuit 133 and the battery cell 136. The heat transferred to the battery protection circuit 133 may be transferred to the battery cell 136 via the second contact thermal conduction member 1235. The battery cell 136 may absorb heat through the first conductive structure 839 and the second conductive structure 1039 contact-mounted in the battery protection circuit 133 and reduce an integrated heat of the electronic component 114 mounted in the PCB 113.

The second contact thermal conduction member 1235 made of a material having high thermal conductivity becomes a thermal conductor to perform a function of the thermal conduction member 131 shown in FIG. 1B. Further, the first conductive structure 839 made of a material, such as copper having high thermal conductivity becomes a thermal conductor to perform a function of the thermal conduction member 131 shown in FIG. 1B.

Referring to Equation 2, due to the first conductive structure 839 and the second contact thermal conduction member 1235, thermal conductivity K may increase. For example, by reducing a temperature difference ΔT inversely proportional to thermal conductivity K, even if a temperature of the electronic component 114 rises a little, heat of the electronic component 114 can be easily conducted to the battery cell 136.

As described above, according to the present disclosure, by conducting heat of an electronic component attached to a PCB of a portable electronic device to a battery, a temperature of the PCB can be reduced.

While the present disclosure has been shown and described with reference to various changes in form and details may be therein without departing from the spirit and scope of the present disclosure as defined in the appended claims and their equivalents.

What is claimed is:

1. A portable electronic device comprising:
    a printed circuit board (PCB) in which at least one electronic component is disposed; and
    a battery pack separately disposed at a gap from the PCB in the portable electronic device, the battery pack comprising a battery cell and a thermal conductor,
    wherein the thermal conductor of the battery pack comprises one portion and another portion connected to the one portion,
    wherein the one portion of the thermal conductor is attached to the outside of the battery pack to absorb heat of the at least one electronic component, and
    wherein the other portion of the thermal conductor is located in the battery pack and contacted with the battery cell to transfer heat absorbed by the one portion of the thermal conductor to the battery cell.

2. The portable electronic device of claim 1, further comprising a cover that can be separated from the electronic device and that comprises an antenna.

3. The portable electronic device of claim 1, wherein the thermal conductor is made of a material comprising at least one of Aluminum (Al), Copper (Cu), Graphite, and Boron Nitride (BN) or a mixture thereof.

4. The portable electronic device of claim 1, further comprising:
    a battery protection circuit formed with a flexible PCB; and
    a conductive structure surface-mounted in the battery protection circuit.

5. The portable electronic device of claim 4, wherein the battery protection circuit comprises:
    a rigid battery protection circuit positioned at a case holder and a battery case of the battery pack to absorb heat of the at least one electronic component opposite to the battery pack; and
    a flexible battery protection circuit positioned at the case holder and the battery cell to transfer heat of the rigid battery protection circuit to the battery cell.

6. The portable electronic device of claim 4, wherein the conductive structure transfers heat of the at least one electronic component to the rigid battery protection circuit and the flexible battery protection circuit.

7. The portable electronic device of claim 4, wherein the conductive structure is made of a thermal conductive material comprising at least one of Aluminum (Al), Copper (Cu), Graphite, and Boron Nitride (BN) or a mixture thereof.

8. The portable electronic device of claim 1,
    wherein the battery pack comprises an antenna, and
    wherein the thermal conductor comprises:
        a first conductive structure surface-mounted in a battery protection circuit that transfers heat of the at least one electronic component to a second conductive structure; and
        the second conductive structure that transfers heat of the first conductive structure to the battery cell.

9. The portable electronic device of claim 8, wherein the second conductive structure is made of a Cu material.

10. The portable electronic device of claim 4, wherein the thermal conductor further comprises:
    a contact thermal conductive member that transfers heat of the conductive structure to the battery cell and that is mounted in a case holder.

11. The portable electronic device of claim 10,
    wherein the conductive structure is made of a thermal conductive material comprising at least one of Aluminum (Al), Copper (Cu), Graphite, and Boron Nitride (BN) or a mixture thereof, and
    wherein the contact thermal conductive member is made of a thermal interface material (TIM) for conducting and emitting heat of the at least one electronic component.

12. A battery pack for a portable electronic device, the battery pack comprising:
    at least one battery cell; and
    a thermal conductor comprising one portion and another portion connected to the one portion,
    wherein the one portion is attached to the outside of the battery pack to absorb heat of at least one electronic component, and
    wherein the other portion of the thermal conductor is located in the battery pack and contacted with the at least one battery cell to transfer heat absorbed by the one portion of the thermal conductor to the at least one battery cell.

13. The battery pack of claim 12, wherein the thermal conductor is made of a thermal conductive material comprising at least one of Aluminum (Al), Copper (Cu), Graphite, and Boron Nitride (BN) or a mixture thereof or is made of a thermal interface material (TIM) for conducting and emitting heat of the at least one electronic component.

14. A portable electronic device comprising:
    a printed circuit board (PCB);
    at least one electronic component disposed at one surface of the PCB;
    a bracket;
    a contact thermal conductive member configured to attach the at least one electronic component and the bracket at both surfaces thereof, respectively, to absorb heat generated in the at least one electronic component and to transfer the heat to the bracket; and
    a battery pack separately disposed at a gap from the at least one electronic component and comprising a battery cell and a thermal conductor,
    wherein the thermal conductor of the battery pack comprises one portion and another portion connected to the one portion,
    wherein the one portion of the thermal conductor is attached to the outside of the battery pack to absorb heat of the at least one electronic component, and
    wherein the other portion of the thermal conductor is located in the battery pack and contacted with the battery cell to transfer heat absorbed by the one portion of the thermal conductor to the battery cell.

* * * * *